United States Patent
Sun et al.

(10) Patent No.: US 7,042,015 B2
(45) Date of Patent: May 9, 2006

(54) SEMI-TRANSPARENT POWER MONITOR INTEGRATED WITH A LIGHT PRODUCING MODULE

(75) Inventors: Decai Sun, Los Altos, CA (US); Eric Peeters, Fremont, CA (US); Christopher L. Chua, San Jose, CA (US); Francesco Lemmi, Roha (IT); Patrick Y. Maeda, Mountain View, CA (US); Scott Solberg, Mountain View, CA (US)

(73) Assignee: Xerox Corporation, Stamford, CT (US)

( * ) Notice: Subject to any disclaimer, the term of this patent is extended or adjusted under 35 U.S.C. 154(b) by 348 days.

(21) Appl. No.: 09/924,840

(22) Filed: Aug. 8, 2001

(65) Prior Publication Data

US 2002/0003231 A1    Jan. 10, 2002

Related U.S. Application Data

(63) Continuation-in-part of application No. 09/469,122, filed on Dec. 21, 1999, now Pat. No. 6,794,725.

(51) Int. Cl.
*H01L 31/12* (2006.01)
(52) U.S. Cl. .......................... 257/81; 257/80
(58) Field of Classification Search .................. 257/80, 257/81
See application file for complete search history.

(56) References Cited

U.S. PATENT DOCUMENTS

| | | | |
|---|---|---|---|
| 4,122,479 A * | 10/1978 | Sugawara et al. | 257/82 |
| 4,181,901 A * | 1/1980 | Heyke | 372/31 |
| 4,812,415 A | 3/1989 | Yamazaki et al. | |
| 5,142,381 A | 8/1992 | Kitamura et al. | |
| 5,475,211 A | 12/1995 | Ogura et al. | |
| 5,528,272 A | 6/1996 | Quinn et al. | |
| 5,568,320 A | 10/1996 | Rees et al. | |
| 5,613,861 A | 3/1997 | Smith et al. | |
| 5,654,559 A * | 8/1997 | Spaeth et al. | 257/82 |
| 5,742,630 A * | 4/1998 | Jiang et al. | 372/50 |
| 5,838,703 A * | 11/1998 | Lebby et al. | 372/43 |
| 5,841,565 A | 11/1998 | Kanai | |
| 5,843,802 A | 12/1998 | Beernink et al. | |
| 5,848,685 A | 12/1998 | Smith et al. | |
| 5,859,658 A | 1/1999 | Hammond | |
| 5,914,218 A | 6/1999 | Smith et al. | |
| 5,917,534 A | 6/1999 | Rajeswaran | |
| 5,917,603 A | 6/1999 | Tanaka et al. | |
| 5,936,657 A | 8/1999 | Fork | |
| 5,944,537 A | 8/1999 | Smith et al. | |
| 5,978,408 A | 11/1999 | Thornton | |
| 6,005,276 A | 12/1999 | Forrest et al. | |

(Continued)

FOREIGN PATENT DOCUMENTS

JP          03085466 A      4/1991

*Primary Examiner*—Jerome Jackson
(74) *Attorney, Agent, or Firm*—Fay, Sharpe, Fagan, Minnich & McKee, LLP

(57) ABSTRACT

A light-producing device integrated with a power monitoring system include a light-producing device from which light is emitted in wavelengths that can range from approximately 700 nm to approximately 3 microns. A semi-transparent sensor is located such that at least a portion of the light emitted passes through the semi-transparent sensor and at least a portion of light is absorbed by the semi-transparent sensor. The semi-transparent sensor is configured to be semi-transparent at wavelengths that can range from 700 nm to 3 microns. The semi-transparent sensor may also be used with an external light source, for example with fiber-optic cables.

18 Claims, 17 Drawing Sheets

U.S. PATENT DOCUMENTS

| | | |
|---|---|---|
| 6,084,650 A | 7/2000 | Sekiguchi |
| 6,229,158 B1 * | 5/2001 | Minemier et al. ............ 257/81 |
| 6,343,223 B1 | 1/2002 | Chin et al. |
| 6,393,183 B1 | 5/2002 | Worley |
| 6,483,862 B1 * | 11/2002 | Aronson et al. .............. 372/50 |
| 6,670,599 B1 * | 12/2003 | Wagner et al. ........... 250/214.1 |

* cited by examiner

FIG. 9
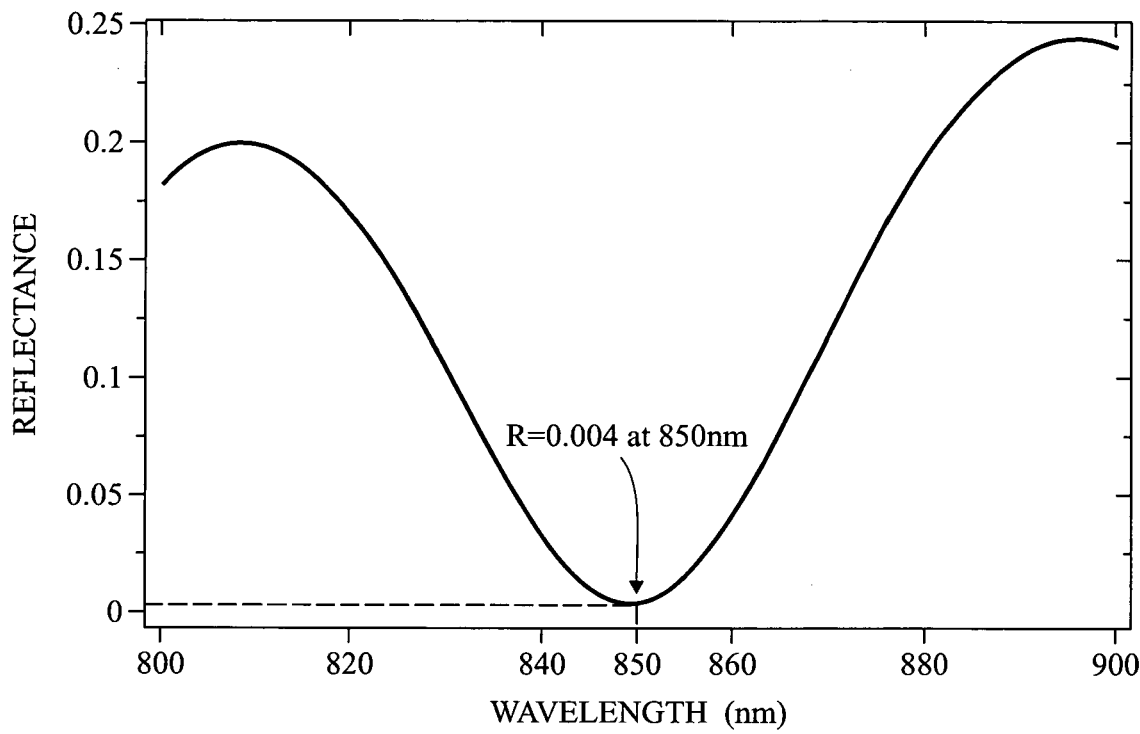
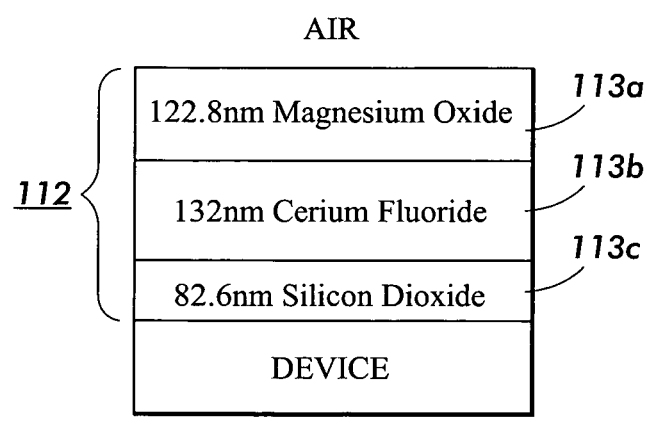
FIG. 10

FIG. 12A
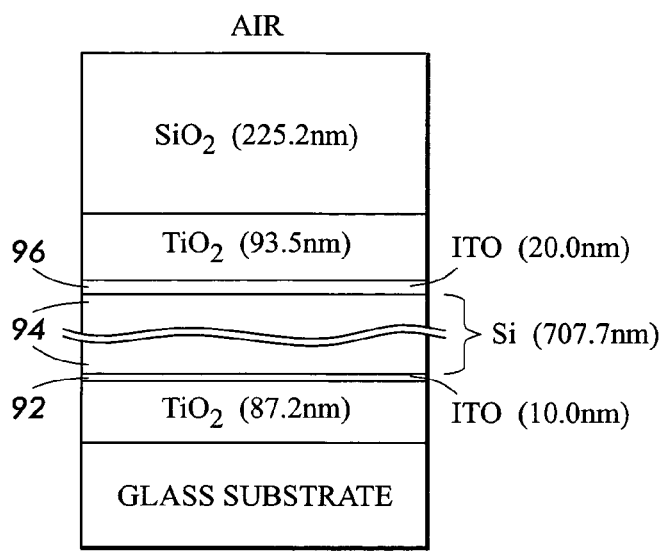
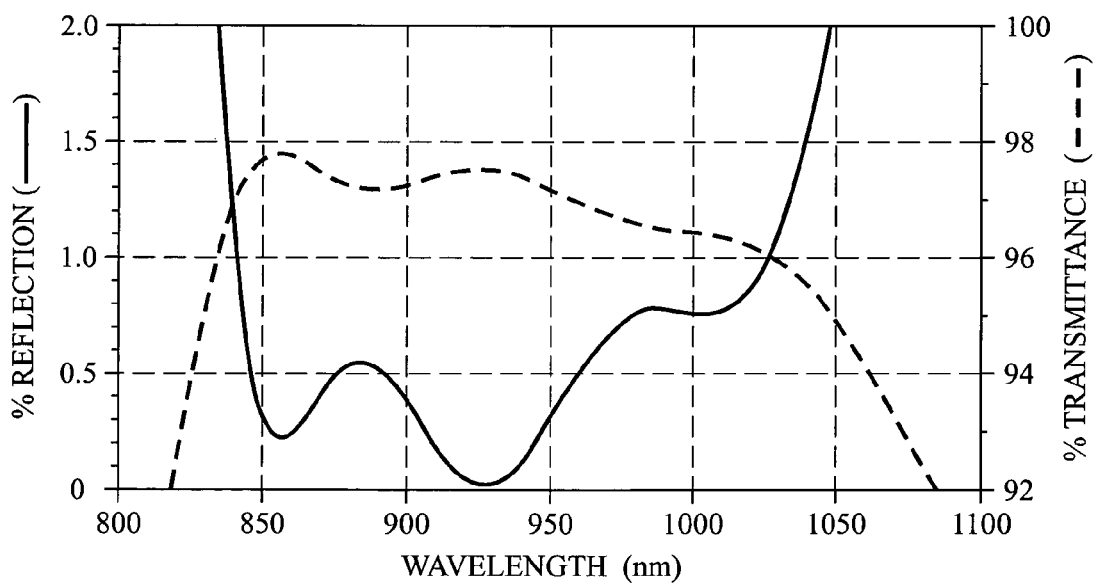
FIG. 12B

SEMI-TRANSPARENT POWER MONITOR INTEGRATED WITH A LIGHT PRODUCING MODULE

This is a continuation-in-part of U.S. Ser. No. 09/469,122 filed Dec. 21, 1999 U.S. Pat. No. 6,794,725 entitled AMORPHOUS SILICON SENSOR WITH MICRO-SPRING INTERCONNECTS FOR ACHIEVING HIGH UNIFORMITY IN INTEGRATED LIGHT-EMITTING SOURCES.

BACKGROUND OF THE INVENTION

This invention relates to the transmission of data via optical devices, and the monitoring of those devices using sensors.

There is ongoing pressure to increase the speed at which data is transmitted, which in turn is driving the demand for high bandwidth fiber optics components. In these systems, it is often necessary to monitor the light output of the components. Normally, part of the light is diverted to a monitor photodiode—a process that leads to high insertion loss and complicated packaging.

One particular type of optical component uses infrared vertical cavity surface-emitting lasers (VCSEL). While the following discussion focuses on VCSEL-based optical transmission devices, it is understood that other light producing modules may equally employ the described concepts. In existing VCSEL-based optical transmitter packages, a photo-diode is used to monitor the output power from the VCSEL.

In FIG. 1, system 10 illustrates one such commercial package. Provided is a TO Can 12, a sensor 16, such as a silicon photo-diode, a light source 18, such as a VCSEL having a gallium arsenide (GaAs) substrate, a beam splitter 20 and a focusing lens 22 which directs a focused light beam 24 to a fiber optic cable 26. When laser beam 28 impinges upon partial reflector 20, a monitoring light beam 30, which is a portion of laser beam 28, is reflected back to photo-diode 16 to be used to monitor the output power from the VCSEL 18.

This configuration is not conducive to monitoring of the laser power from the back side of the laser 18, since the laser is opaque. The one manner in which to attempt to monitor from the backside would be to etch away the substrate at specified areas.

The approach set forth in FIG. 1 requires the implementation of complicated packaging techniques to align the laser 18, the photo-diode 16, the splitter 20 and the fiber 26. This results in high packaging costs and a higher percentage than desirable of defective systems. It is estimated that when used for transmitters, 90% of the manufacturing cost is directed to the packaging.

Therefore, it has been deemed desirable to find a manner of integrating elements of the system including the VCSELs and photo-diodes as well as potentially optical elements to reduce the packaging costs.

SUMMARY OF THE INVENTION

A light-producing and monitoring system includes a device that produces light having wavelengths that can range from approximately 700 nm to approximately 3 microns. A semi-transparent sensor is located in front of the light-emitting region, such that at least a portion of the light emitted passes through the semi-transparent sensor and at least a portion of light is absorbed by the semi-transparent sensor. The semi-transparent sensor is configured to be semi-transparent at the wavelength of interest.

BRIEF DESCRIPTION OF THE DRAWINGS

FIG. 9 is a graphical representation of the reflection occurring in accordance with operation of the sensor described in FIG. 8;

FIG. 10 depicts a further embodiment of a anti-reflection coating which may be used with the sensor according to the teachings of the present invention;

FIG. 12a is a graphical representation for a device configured according to the present invention;

FIG. 12b is a graphical representation of transmission and reflectance characteristics for a device configured according to the present invention for operation optimized at 850 nm;

DETAILED DESCRIPTION OF THE PREFERRED EMBODIMENTS

Figure 1:
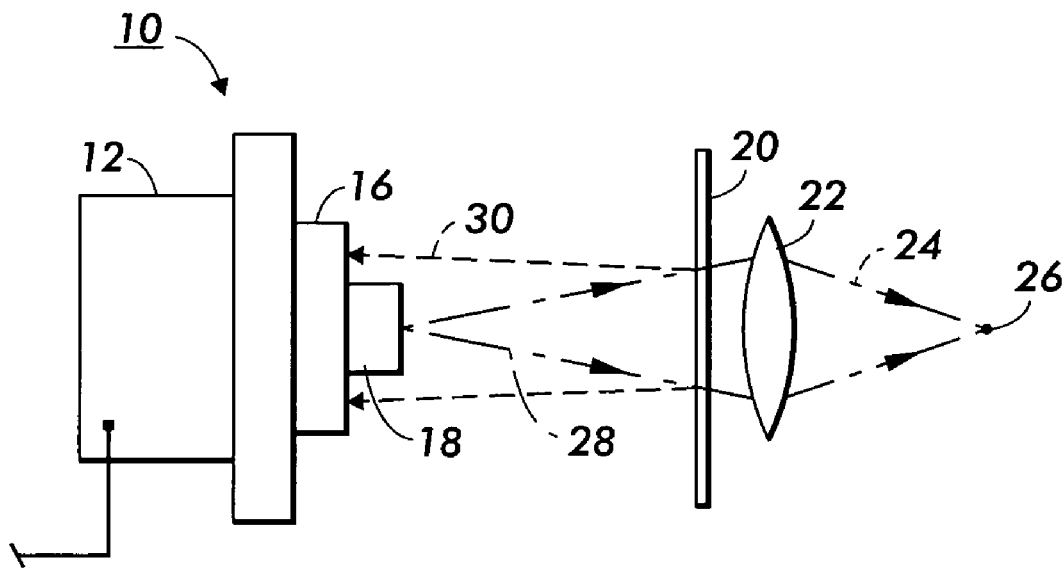
FIG. 1 is a VCSEL-based optical transmitter package in accordance with the prior art.

As depicted in FIG. 1 in existing VCSEL-based optical transmitter package 10, the sensor (i.e. photo-diode 16) receives the monitoring light signal 30 on the same front surface from which the laser beam 28 is emitted.

Figure 2:
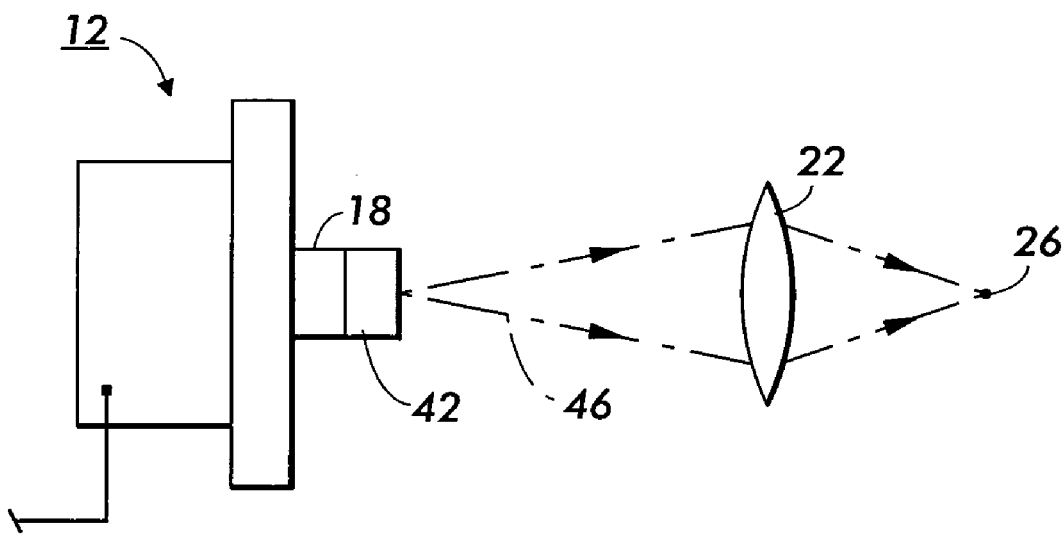
FIG. 2 sets forth an optical transmitter package wherein a sensor according to the teachings of the present invention is implemented.

Turning to FIG. 2, illustrated is an optical transmitter system 40 which employs a semi-transparent sensor 42 that is semi-transparent at the wavelengths used for data transmission, in the range of 700 nm–3 microns. Existing sensor designs did not consider achieving semi-transparency at these wavelengths. It is to be understood that while sensor 42 is noted to be semi-transparent in a range of 700 nm–3 microns in actual implementation the construction may vary dependent upon the specific wavelengths in this range. The necessary designs for specific wavelengths will be described in greater detail below.

Implementing semi-transparent sensor 42, within system 40 permits an arrangement where laser 18 is positioned on substrate 14 behind semi-transparent sensor 42. By inserting semi-transparent sensor 42 within the optical path of beam 46, the semi-transparent sensor 42 absorbs a small amount of emitted laser beam 46 to be used as a sensor light 48 which provides feedback for control of the VCSEL 18, which in this embodiment may be a 850 nm, 380×380 μm VCSEL. Laser beam 46 which passes through sensor 42 is focused by micro-lens 22 in order to provide a focused light to fiber optic device 26. By this design use of partial reflector 20 is not required.

A characteristic of an appropriate semi-transparent sensor is for the sensor to have a high "contrast ratio", also called "light-to-dark" response. Since the sensor will only absorb a fraction of the light passing therethrough, due to its partially transparent nature, it must be able to work even with very small signals. An ideal sensor will have no current flowing when no light exists. Amorphous silicon (a-Si:H) sensors are able to approach this ideal state. Other materials may also be used for the sensor, such as a silicon germanium doped compound.

Figure 3:
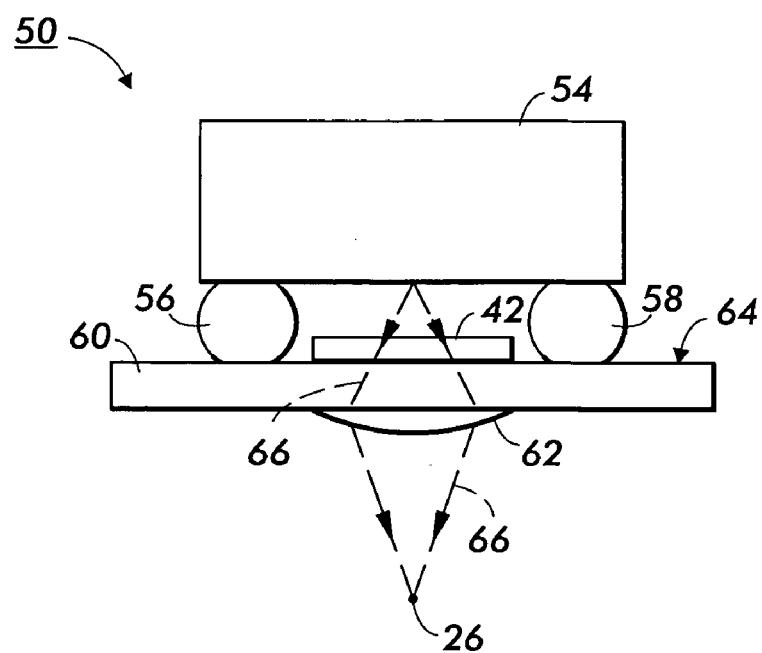
FIG. 3 depicts an optical transmitter package implementing a sensor concept of the present invention and an integrated micro-lens on a single substrate.

Turning to FIG. 3, illustrated is another optical transmission system 50 which implements a semi-transparent sensor 42. In this embodiment, a VCSEL chip 54 is flip-chip bonded by solder bumps 56 and 58, to a quartz substrate 60, aligned to a refractive micro-lens 62 on a second side of quartz substrate 60. The semi-transparent sensor 42 is built on a top surface 64 of quartz substrate 60, inserted in the optical path of laser beam 66. This design allows sensor 42 to monitor the output power of the VCSEL 54. Substrate 60 is also chosen to be semi-transparent at the frequency of operation of VCSEL 54. In this embodiment for example, a quartz substrate may be used and inserted within the optical path for a VCSEL which operates in the range of 700 nm–3 microns. Using the transparent structures of quartz substrate 60 and sensor 42, the total absorption of the system can be controlled to below 10%. It is also to be noted the solder bumps used in the flip-chip technique of the foregoing embodiments, provide an air gap of approximately 50–100 microns which is equivalent to the height of the solder bumps between the substrate and laser.

With attention to FIGS. 2 and 3, it is noted that FIG. 2 is shown with a lens structure not integrated to the system, and FIG. 3 illustrates a micro-lens 62 built on top of quartz substrate 60. It is to be appreciated that system 40 of FIG. 2 may be designed With an integrated micro-lens such as shown in FIG. 3, and the system 50 of FIG. 3 may be designed with a non-integrated lens such as shown in FIG. 2.

It is also to be understood that while FIG. 3 illustrates the connection between substrate 60 and VCSEL 54 via the use of solder bumps 56 and 58 implementing flip-chip technology, other forms of integrating the components of the systems in FIGS. 2 and 3 may be used. For instance, substrate 60 may be etched with a cavity area into which the laser and other components are held. Other connection techniques may also be used such as the micro-spring techniques of U.S. Ser. No. 09/469,122 hereby incorporated by reference.

Figure 4:
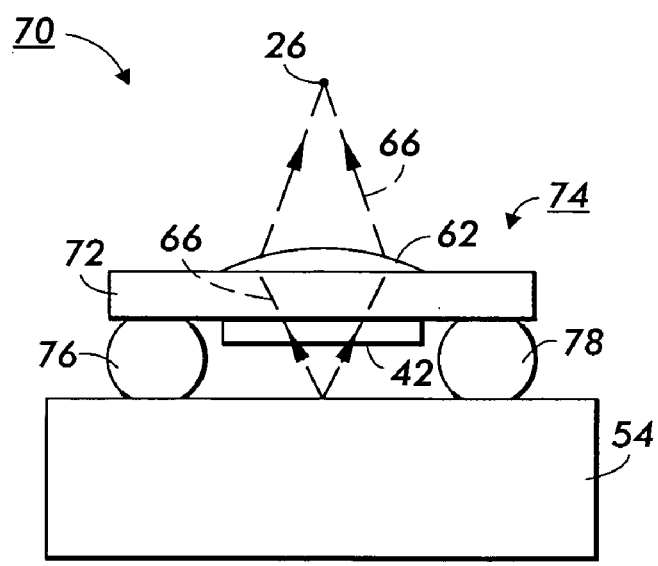
FIG. 4 illustrates a further embodiment of a sensor according to the present invention integrated with a microlens on a single substrate.

Turning to FIG. 4, illustrated is an optical transmitter system 70, where a VCSEL 54 is integrated with substrate 72 having formed thereon semi-transparent silicon sensor 42 and micro-lens 62. More particularly, system 70 allows for an integrated transmitter to be packaged in a TO Can. In this embodiment, semi-transparent sensor 42 and micro-lens 62 are integrated on quartz substrate 72 as a sensor chip 74. Thereafter, sensor chip 74 with the built-in sensor and micro lens is attached to the VCSEL 54. Such interconnection may be accomplished by many connecting schemes including flip-chip bonding using solder bumps 76 and 78, as well as other discussed techniques. Though not shown, electrical contacts of the amorphous silicon sensor 42 may be passed on to wire bonding pads on the top surface of the VCSEL 54. These wire bonding pads will be isolated from the VCSEL using a dielectric layer. The entire module is then solder bonded to a heat sink in a TO Can.

In certain embodiments, the micro-lens may be eliminated and a discrete lens or collimator can be used outside the TO Can to collimate the light into a multi-mode fiber or other receiving element. In still a further embodiment, substrate 72 is configured as a thin layer which is made part of micro-lens 62.

When the foregoing system implements a micro-lens, several approaches may be taken including using the quartz substrate. In one embodiment, the micro-lens is fabricated directly out of the quartz substrate by reflowing a polymer micro-lens pattern. The micro-lens is then transferred to the quartz substrate by one of various plasma etching techniques. Also, in addition to refractive micro-lenses, diffractive Fresnel lenses can be used for the focusing of light as well, and the illustrated lens 22,62 are intended to represent all such potential types.

In determining the dimensions of a refractive micro-lens for one embodiment, the diameter will be 100 μm and the thickness is 7 μm. The focal length of the lens is then calculated to be 300 μm. When used in a one-to-one imaging situation from the VCSEL to a multi-mode fiber, the spacing from the VCSEL to the micro-lens will need to be twice that of the focal length, which for a VCSEL operating at 850 nm is 600 μm. Considering that in one embodiment the divergence of the VCSEL is 10° at FWHM, the spot of the laser beam is approximately 105 μm at the surface of the lens which is slightly larger than the diameter of the lens. Since the VCSEL aperture is typically less than 20 μm in diameter for a transmitter/transceiver application, and the diameter of a multi-mode fiber is between 50–65 μm, the spacing between the VCSEL and the micro-lens can be in the range of 1f and 2f (where f is the focal length), so that the beam spot is magnified at the input of the fiber. By this design, the fiber will not be underfilled.

It is noted that when constructing transmission systems where the micro-lens is integrated, the integration of the optical transmitter can start with the fabrication of the micro-lens on the quartz substrate. Then, taking care not to damage the micro-lens, the amorphous sensor may be fabricated on the opposite side of the quartz substrate with the sensor aligned to the micro-lens. After the sensor has been fabricated, solder bumps may be formed on the sensor side of the quartz substrate. Thereafter a VCSEL or other light source is attached to the top of the semitransparent silicon sensor. In this embodiment, solder-wetting metal pads (typically Ti/Au) on the VCSEL match the solder bump array on the quartz substrate. After VCSEL is flip-chipped in place, the assembly is heated above the melting point of the solder (in one embodiment, around 230° C. for eutectic PbSn solder). Care should be taken to ensure that the reflow temperature is sufficiently low so as not to damage the sensor. Melted solder bumps reflow and settle into an equilibrium shape and pull the VCSEL into alignment with the sensor and the micro-lens.

Turning attention more particularly to the design of the semi-transparent sensor, attention is directed to FIGS. 5a–d and 6a–d, which are cross-sectional and top views of a process used to form sensor 42 integrated on substrate 16.

Figure 5A:
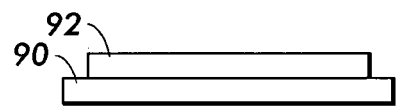
FIGS. 5a–5d depict one embodiment of constructing a semi-transparent sensor according to the teachings of the present invention.
Figure 6A:
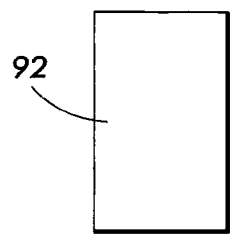
FIGS. 6a–6d illustrate a top view of the construction in accordance with FIGS. 5a–5d.

Turning to FIGS. 5a and 6a, illustrated is a first stage of the process flow for the construction of a semitransparent sensor to be formed on a transparent substrate such as Corning 1737 glass 90, fused silica, quartz or silicon at longer wavelengths. This embodiment will set forth configurations for a sensor which will be semi-transparent in the 850 nm light wavelength range. In the first stage a transparent/conductive layer 92, such as indium tin oxide (ITO), tin oxide, zinc oxide, polycrystalline silicon or other appropriate material is patterned in accordance with known techniques. Transparent/conductive layer 92 needs to be transparent such that it does not block light emitted from lasers 12 in the 850 nm wavelength range, and is required to be conductive as it will act as a first electrode of the sensor. To meet these requirements, ITO layer 42 is selected to be approximately 55 nm thick.

Figure 5B:
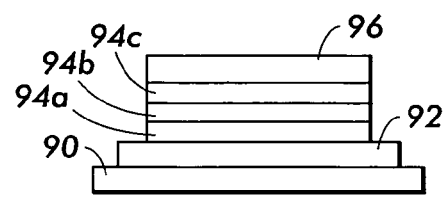
Figure 6B:
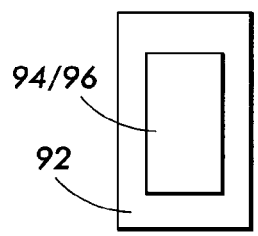

Turning to stage 2, illustrated by FIGS. 5b and 6b, a hydrogenated amorphous silicon sensor (a-Si:H) component or active sensor element 94 is grown on top of the first transparent/conductive layer 92. Active sensor element 94 is shown comprised of three sub-layers. The first sub-layer 94a, is a $n^+$-doped layer of material, typically less than 1,000 angstroms in thickness and more preferably 50 nm thick. Though not limited thereto, first sub-layer 94a may be a $n^+$ phosphorous-doped amorphous silicon, or $n^+$ arsenic-doped silicon. A second sub-layer 94b is intrinsic amorphous silicon, of a thickness less than a micron, in the range of 1 µm thick. The third sub-layer 94c of sensor element 94 is a $p^+$ doped amorphous silicon approximately 50 nm thick. An example of a $p^+$-doped amorphous silicon which may be used as third layer 94c is $p^+$ boron-doped amorphous silicon. The amorphous sensor active component 94 may also be made of hydrogenated amorphous silicon-germanium compound (a-SiGe:H).

Following deposition of active sensor element 94, a second transparent/conductive layer 96 is deposited on top of sensor element 94. Sensor element 94 and second transparent/conductive layer 96 may be patterned together in a single process or separately. Layer 96 in this embodiment may be the same material as layer 92, such as a layer of ITO, tin oxide, zinc oxide, Polycrystalline silicon or other appropriate material having a thickness of approximately 55 nm. By this design, active sensor element 94 in the present embodiment is an amorphous silicon sensor, which is opaque in visible light, and substantially transparent at an IR wavelength at and around 850 nm.

Figure 5C:
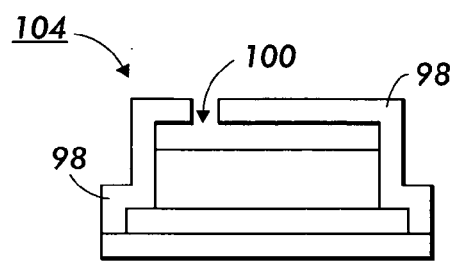
Figure 6C:
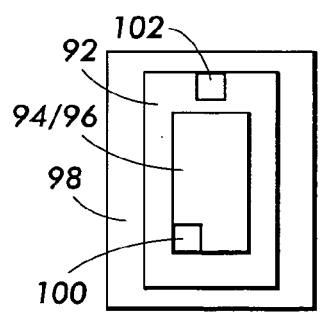

Turning to stage 3 of the process, shown in FIGS. 5c and 6c, passivation layer 98 is deposited. Passivation layer 98 may be amorphous silicon-nitride (SiNx), oxynitride, or polyamide among other possible choices. Layer 98 acts as a passivation layer for the sensor by being electrically insulating and, is also formed to be transparent in the wavelength range emitted by the lasers associated with the sensor. In this embodiment, therefore passivation layer 98 is made in a thickness of about 3,000 nm Two vias are provided through passivation layer 98 to allow contact to transparent/conductive layers 92 and 96. First via 100 and second via 102 may be seen clearly in top view FIG. 6c. The first via 100 provides an opening to second transparent/conductive layer 96 and second via 102 provides an opening to first transparent/conductive layer 92. These openings are used to provide access to layers 92, 96 since the passivation layer 98 is formed from an electrically insulating material and, since layers 92 and 96 act as electrodes of the sensor.

At this point, an electrically protected semi-transparent sensor 104 is formed which is semi-transparent in the 850 nm wavelength range. Again, the sensor consists of first transparent/conductive layer 92, sensor element 94, second transparent/conductive layer 96 passivation layer 98, and vias 100, 102 which provide electrical access to sensor 104.

Figure 5D:
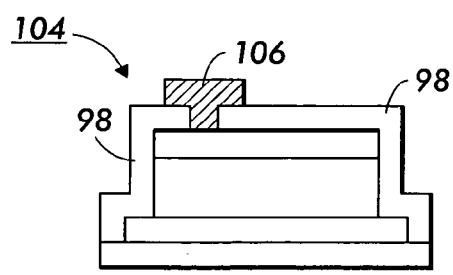
Figure 6D:
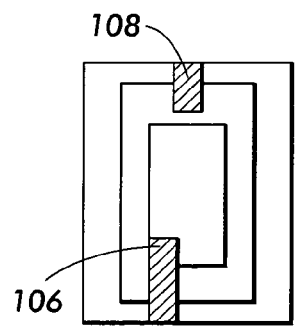

Attention is now directed to a stage 4 which may be undertaken and is illustrated in FIGS. 5d and 6d. In this stage, metal patterns 106 and 108 are deposited directly onto passivation layer 98 and into vias 100 and 102. Metal patterns 106, and 108, may be deposited during the same processing steps.

In one preferred embodiment, metal patterns 106 and 108 are made a highly conductive material such as gold or other appropriate material. Depositing of the metal patterns 106 and 108 may be achieved by many methods including electron-beam deposition, thermal evaporation, chemical vapor deposition, sputter deposition or other methods.

After metal layers for patterns 106 and 108 have been deposited, they are patterned by photolithography into desired designs. Metal patterns 106, 108 are used as sensor readout lines and contact elements to the first transparent/conductive layer 92 and second transparent/conductive layer 96, which act as electrodes for sensor 104.

Light being directed to sensor 104 may either be absorbed, transmitted, or reflected. Reflection of light is undesirable as compared to the other possibilities, since if light is absorbed, the sensor is using it to determine an appropriate feedback to the system, and if light passes through, it is being used by the target device, for instance to transmit voice, data, or video data in a communication transmission system, create a latent image on an electrostatic drum or for other useful purposes. On the other hand, reflected light is wasted light.

Figure 7:
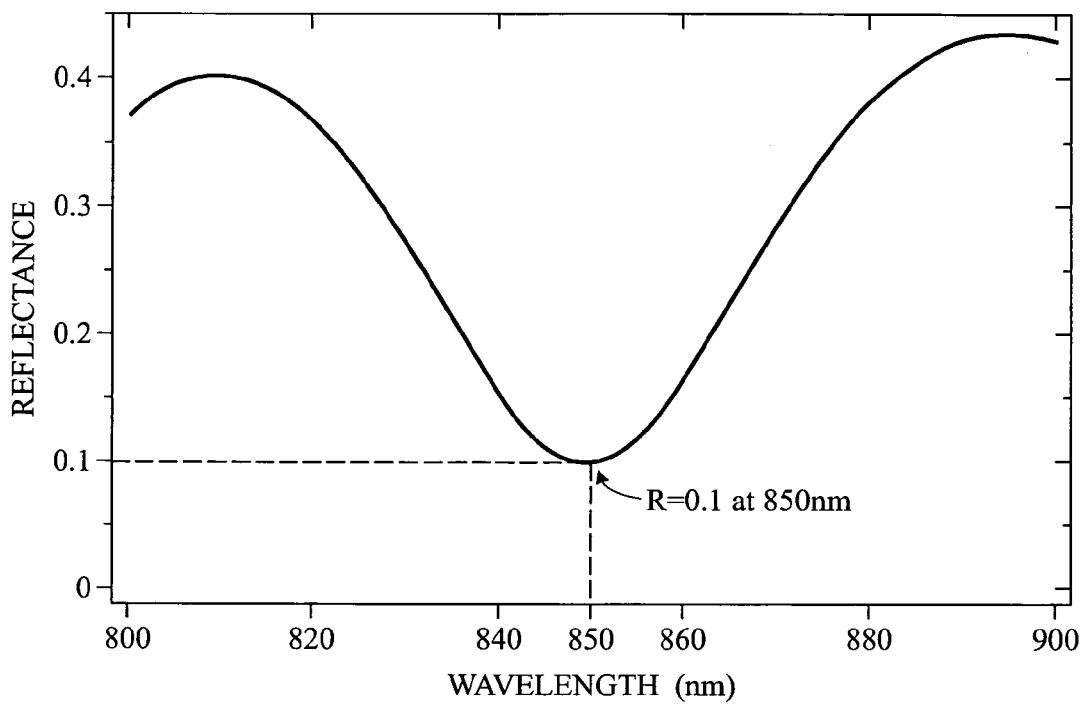
FIG. 7 sets forth a graphical representation of reflectance existing at a 850 nm wavelength.

FIG. 7 is a graphical representation of the reflectivity of a sensor as configured in accordance with FIGS. 5a–d and 6a–d when operated with a laser at 850 nm. As can be seen, reflectivity is equal to 10% at the 850 nm wavelength. This means that a percentage of laser light is lost and unusable. In order to improve this situation, the present embodiment adds a further layer to the sensor described in connection with FIGS. 5a–d and 6a–d.

Figure 8:
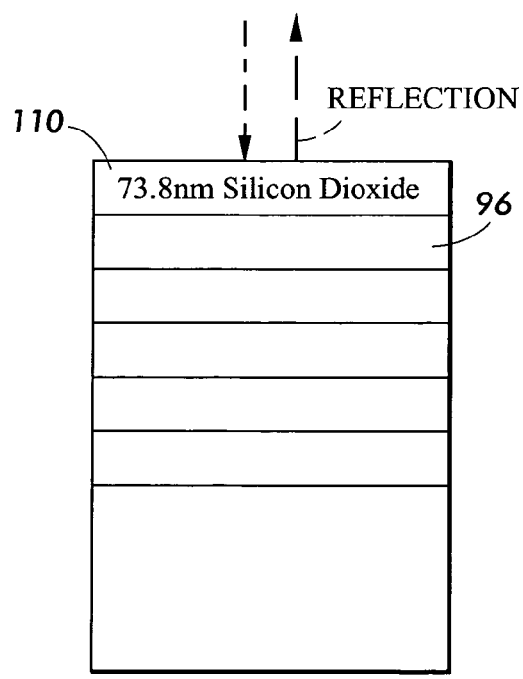
FIG. 8 depicts representation of a semi-transparent sensor according to the present invention further implementing an anti-reflection layer.

Particularly, an impedance-matching layer 110, as shown in FIG. 8 is patterned on top of the ITO layer 96. Layer 110 is an anti-reflection coating and in one embodiment may be a layer of silicon dioxide of 73.8 nm thick. This thickness is used to match the wavelength of 850 nm assumed in the present embodiment. It is to be appreciated that while silicon dioxide is in one embodiment used as the anti-reflection layer 110, other anti-reflection coatings including silicon nitride or other dielectrics with a proper refractive index and proper thickness may be implemented.

The addition of layer 110 minimizes the reflection loss, as evidenced in FIG. 9. More specifically, when implementing anti-reflection layer 110, the reflection loss at approximately 850 nm is reduced to 0.4%.

Figure 11:
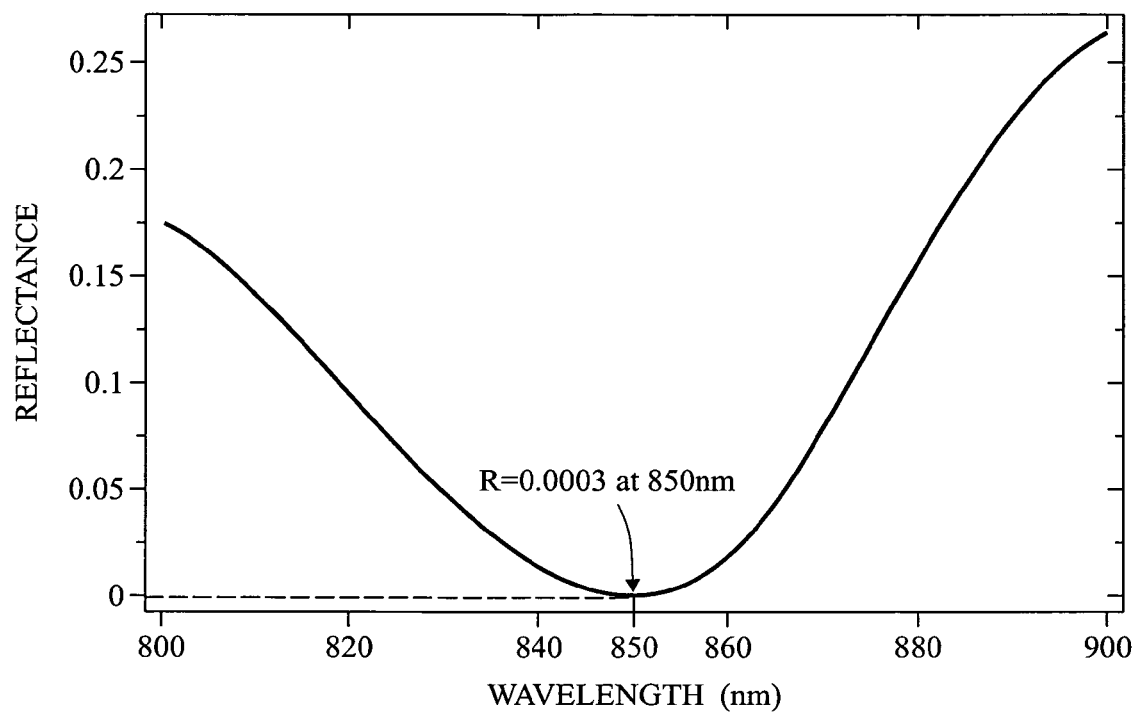
FIG. 11 sets forth a representation of the reflection achieved using the anti-reflection layer of FIG. 10.

A further embodiment of anti-reflection layer 110 is shown for example in FIG. 10. In this figure, the layer includes three sub-layers including a 122.8 nm sub-layer of magnesium-oxide 113*a*, a 132 nm sub-layer of cerium-fluoride 113*b*, and a 82.6 nm sub-layer of silicon-dioxide 113*c*. The more sophisticated anti-reflection layer 112 of FIG. 10 further minimizes reflection loss as shown by the graph of FIG. 11, where the reflection loss is shown to be approximately 0.03% at 850 nm.

In yet another embodiment, a sensor according to the present invention such as taught for example in the forgoing figures, may be implemented with a first layer of TiO2 87.20 nm thick, an ITO electrode layer 10 nm thick, an amorphous silicon sensor region of 707.68 nm, a second indium tin-oxide (ITO) electrode 20 nm thick, a layer of titanium-oxide (TiO2) having a thickness of 93.46 nm, and a silicon-oxide (SiO2) layer having a thickness of 225.5 nm. This embodiment features a dielectric layer beneath the first electrode 92 and has a large transmission bandwidth that allows operation at a wide range of wavelengths.

Turning attention to FIGS. 12*a*–*b*, provided is a graph of light transmittance versus light wavelength (nm) for a device, shown as a block diagram, configured using the above materials in the recited thicknesses. As may be observed in this graphical representation, the highest percentage of light passage is at approximately the 850 nm wavelength, where light transmittance reaches nearly 98 percent.

Figure 13:
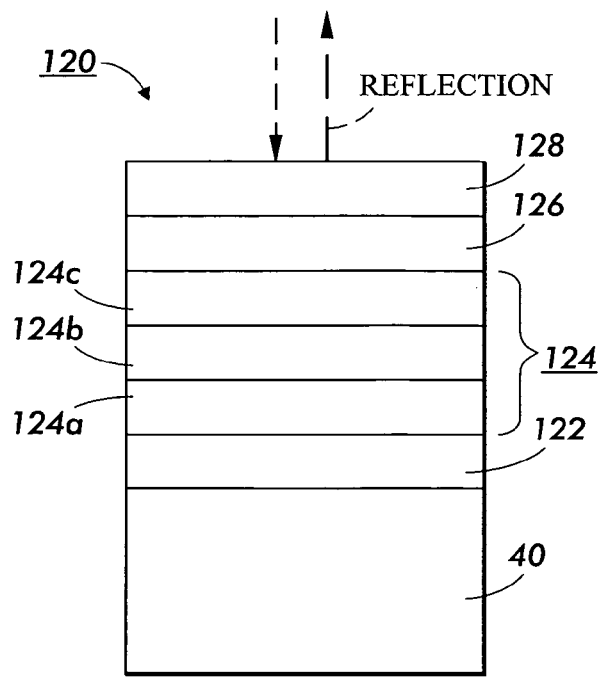
FIG. 13 is a graphical representation of a semi-transparent sensor for operation in accordance with a light-emitting device at 1300 nm.

Turning to FIG. 13, shown is an embodiment of an amorphous silicon sensor 120 whose layers and thickness have been optimized for low reflection when used with a light-emitting device such as a laser generating a wavelength in the range of 1.1 to 1.4 microns and preferably at 1.3 microns. Optical transmitters/transceivers operating in this range are commonly used in the telecommunication industry.

This embodiment contains similar process techniques as that shown in FIGS. 5*a*–*d* and 6*a*–*d* and similar layers will be commonly numbered. For example, the transparent substrate 40 may be the same thickness as that of FIGS. 5 and 6 and may also be, but is not limited thereto, a Corning 1737 glass, fused silica or quartz. Layer 122 is a transparent electrode such as an ITO. However, the thickness of this ITO or other appropriate material will preferably be approximately 48.7 nm. Similar to the layer 42 of FIGS. 5 and 6, this electrode may be comprised of other materials such as zinc-oxide or polycrystalline silicon.

Active sensor portion 124 includes a n+ doped silicon photo-detector sub-layer (e.g. n+ phosphorus-doped amorphous silicon, or n+ arsenic-doped silicon, or other appropriate material) 124*a* having a thickness of about 50 nm. A second sub-layer 124*b* may be an intrinsic amorphous silicon having a thickness of 1.189 μm, and a third layer 124*c* may be a p+ doped amorphous silicon having a thickness of about 50 nm. Other materials which may be used in the configuration of the sensor include Ge alloys of a-Si.

Formed on top of portion 124 is a second transparent electrode 126 such as an ITO having a thickness of approximately 48.7 nm. Another possibility for this electrode includes zinc-oxide, polycrystalline silicon or other appropriate conductive material. An impedance-matching layer 128, of an appropriate thickness and refractive index, is then laid on top of layer 126.

Figure 14:
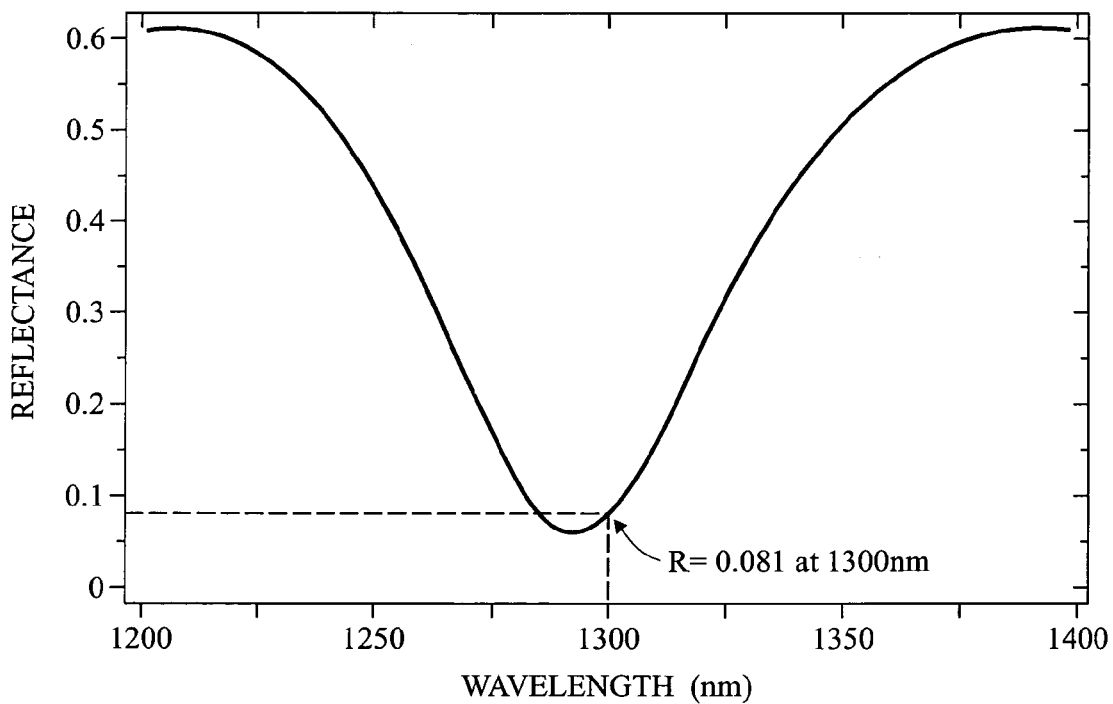
FIG. 14 sets forth a graphical representation of reflectance occurring in accordance with operation of the sensor described in FIG. 13.

As can be seen in FIG. 14, a sensor configured according to the teachings of FIG. 13, without a sensor-matching layer 128, will have a reflectivity loss of 8.1% at a laser light output wavelength of approximately 1300 nm.

Figure 15:
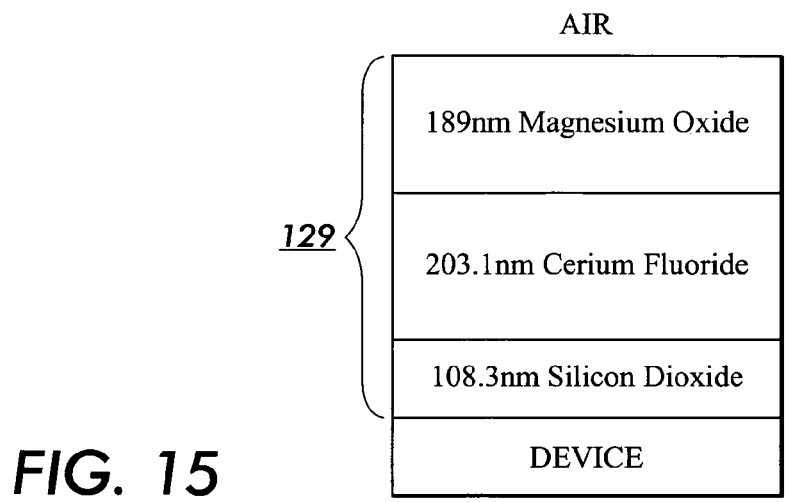
FIG. 15 depicts a more detailed view of one embodiment of an anti-reflection layer described in FIG. 13.
Figure 16:
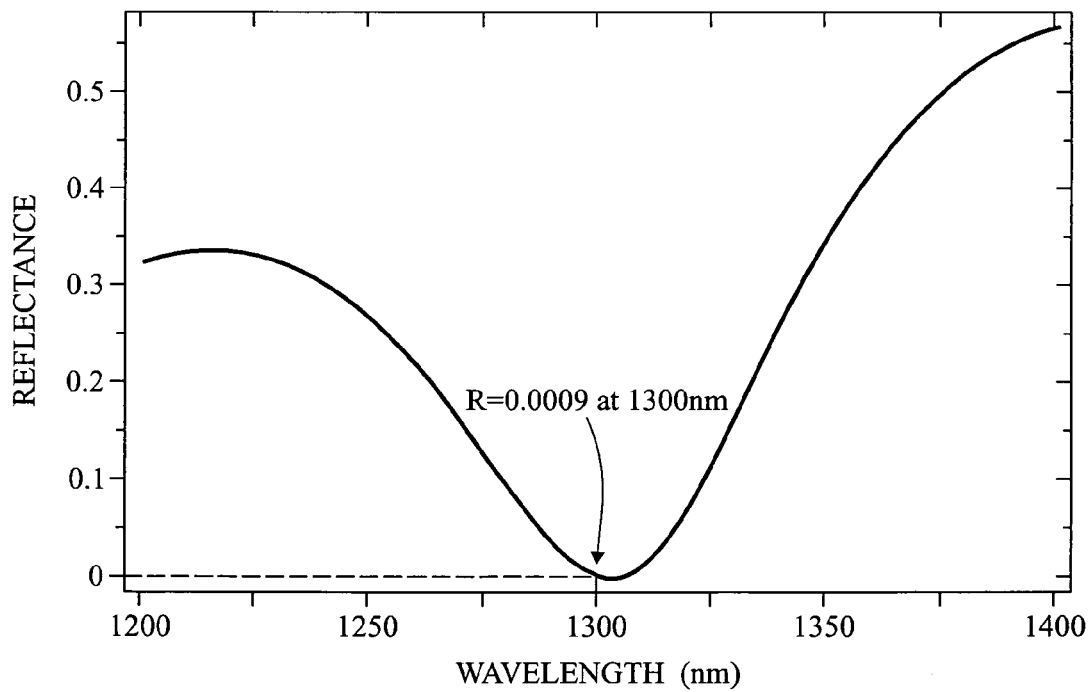
FIG. 16 depicts the reflectance using a semi-transparent sensor in accordance with the teachings of FIG. 15.

When an anti-reflection layer 129 having a 189 nm layer of magnesium-oxide, a 203.1 nm layer of cerium-fluoride, and a 108.3 nm layer of silicon-dioxide as shown in FIG. 15, is placed above the upper electrode, then as shown in FIG. 16, the reflection losses drop to 0.09% at about 1300 nm.

In another embodiment, an amorphous silicon sensor such as 120 of FIG. 13 has the thicknesses of its layers altered to be advantageously used with light-emitting lasers functioning in the wavelengths in the range of 1.4–1.6 microns, and preferably 1.5 microns. This range of wavelengths are commonly used in the telecommunication industry.

When designing semi-transparent sensors for long wavelength operation (greater than 1.3 microns), particular attention should be made on the selection of electrode material as ITO becomes increasingly absorptive at long wavelengths. If ITO is used, its thickness, oxygen content and position relative to the other layers should be optimized using standard optical modeling and process development techniques to reduce insertion loss.

Figure 17A:
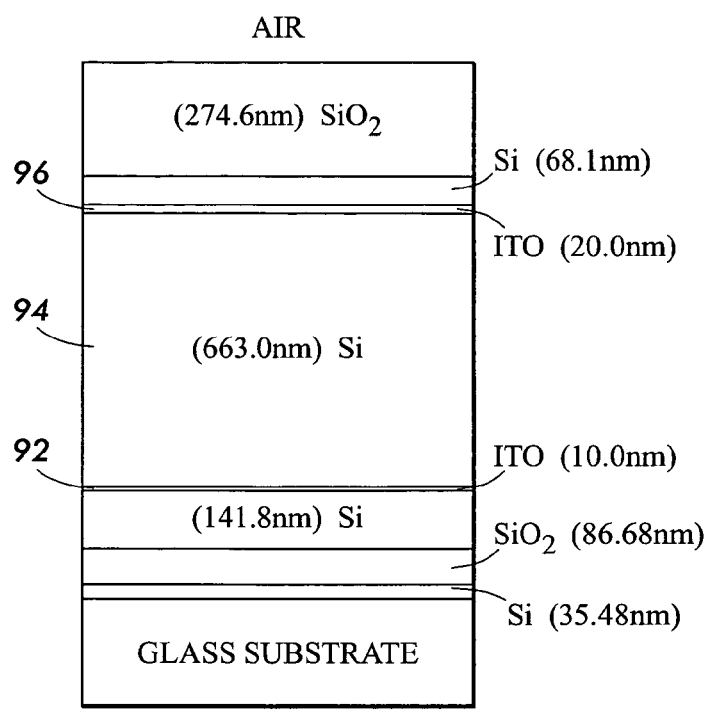
FIGS. 17a–19b are graphical representations of devices according to the present invention, and of the optical transmittance, the light wavelength and reflectance for devices constructed according to the teachings of the present invention, using different materials and layer thicknesses.
Figure 17B:
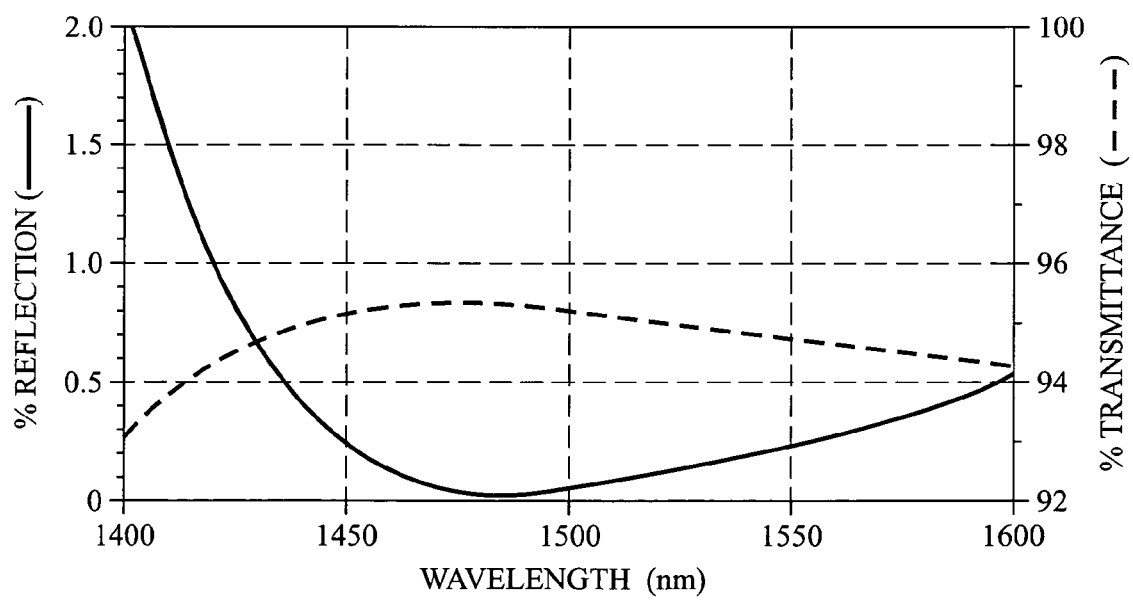

FIGS. 17*a*–*b* show a graph of light transmittance versus light wavelength (nm) for a specific design which may be implemented in accordance with the teachings of this application. More specifically, the operational characteristics shown in FIG. 17*b* are for a device, as shown in FIG. 17*a*, with a layer of silicon having a thickness of approximately 35.48 nm deposited on a glass substrate. A SiO2 layer having a thickness of approximately 86.68 nm is positioned above this silicon layer. A second silicon layer having a thickness of approximately 141.84 nm is then placed above the SiO2 layer. A lower ITO electrode having a thickness of approximately 10 nm is placed next, upon which is positioned an amorphous silicon (Si) sensor region approximately 663 nm thick, followed by an upper ITO electrode having a thickness of approximately 20 nm thick. Above the upper ITO electrode is placed another silicon layer having a thickness of approximately 68.10 nm, and a final SiO2 top layer of approximately 274.59 nm thick.

Such a design, as shown by the graph of FIG. 17*b*, produces a generally high level of transmittance of approximately 95% of light at the 1500 nm wavelength. Unlike more conventional anti-reflection designs, this embodiment features several dielectric layers below the first electrode. The design produces a large transmission window that allows operation at a wide range of wavelengths. This wide transmission bandwidth is especially useful in optical communication applications utilizing wavelength division multiplexing.

Figure 18A:
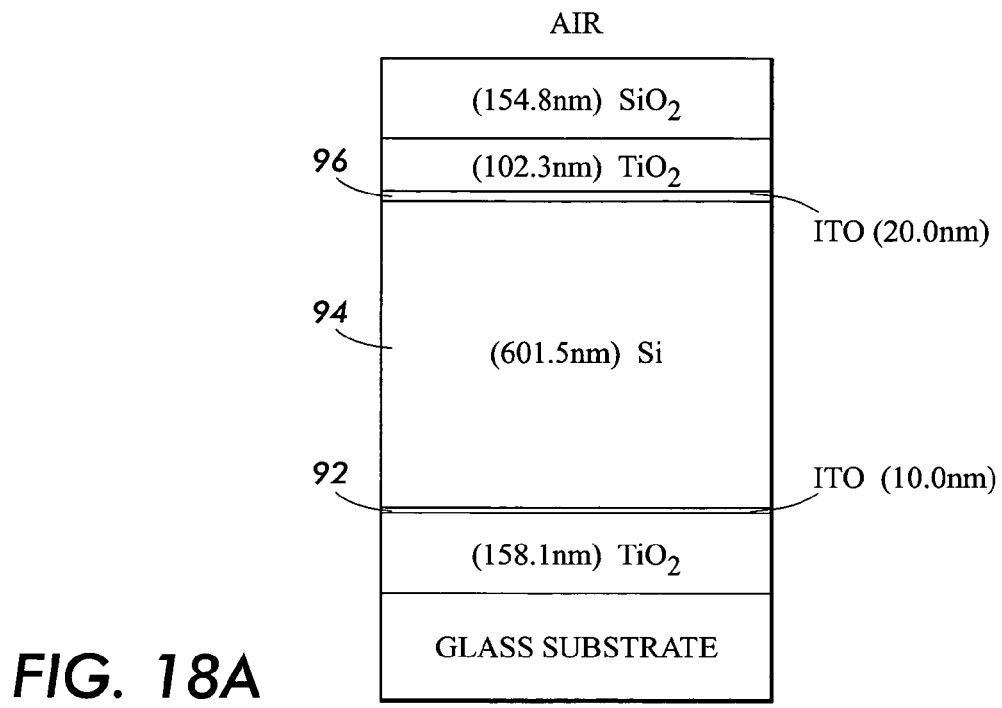
Figure 18B:
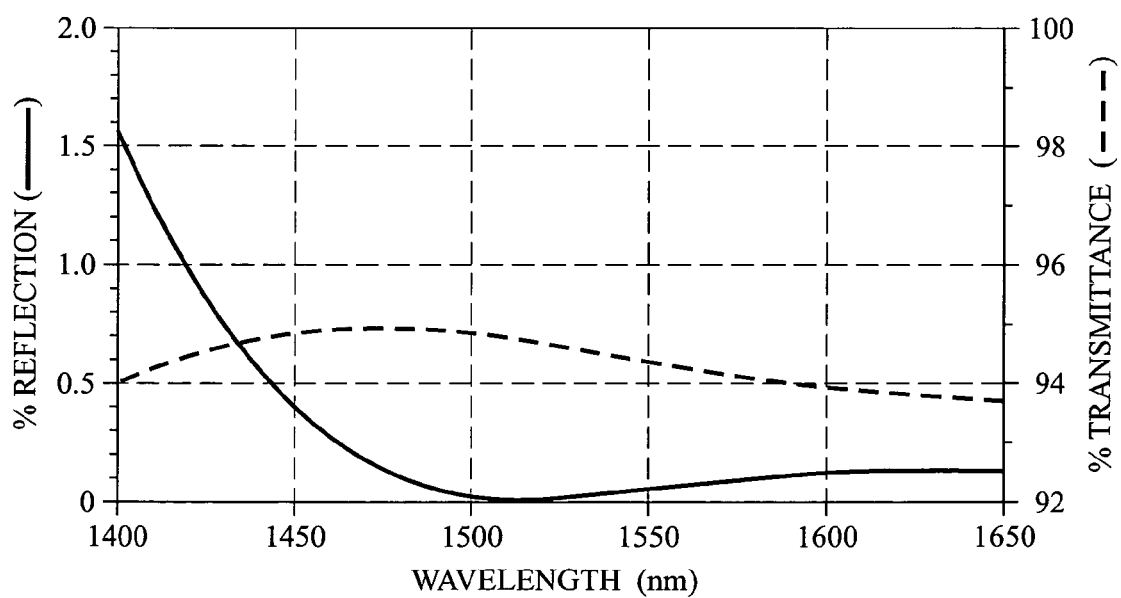

Turning to FIGS. 18*a*–*b*, illustrated is a graphical representation for a further device according to the present invention which is intended to have a high transmittance at 1500 nm. It is noted that this device, as shown in FIG. 18*a*, includes a first TiO2 layer of 158.13 nm, a first ITO layer of 10 nm, upon which is placed a Si layer of 601.47 nm. Thereafter, located on top of the silicon layer is a second ITO layer of 20 nm, a TiO2 layer of 102.26 nm, and finally a SiO2 layer of 154.79 nm. For this design, the light transmission at 1500 nm wavelength is slightly below 95%.

Comparing the design of FIG. 17a with the design of FIG. 18a, it is noted that the design of FIG. 18a has an advantage of fewer deposition cycles, as the TiO2 and the SiO2 may be deposited in the same batch as the ITO. However, when using this design, there is concern with the manner in which the photovolatic Si layers will grow on the TiO2.

Figure 19A:
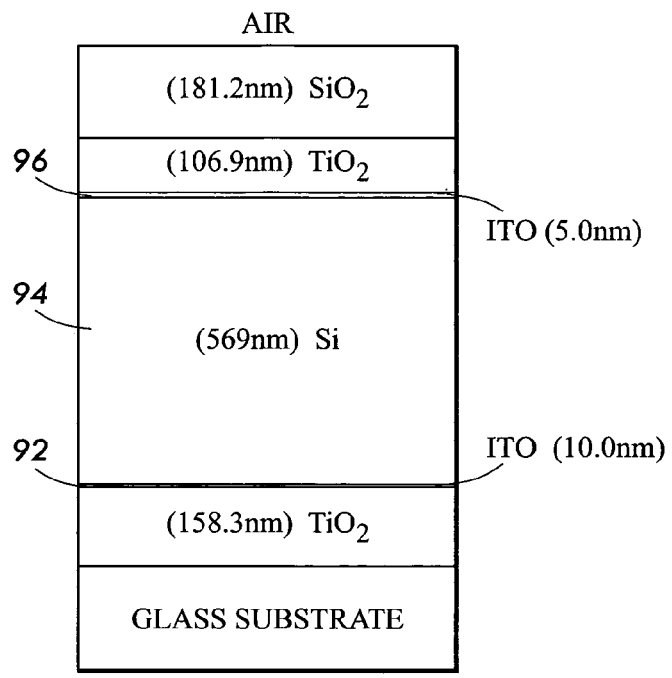
Figure 19B:
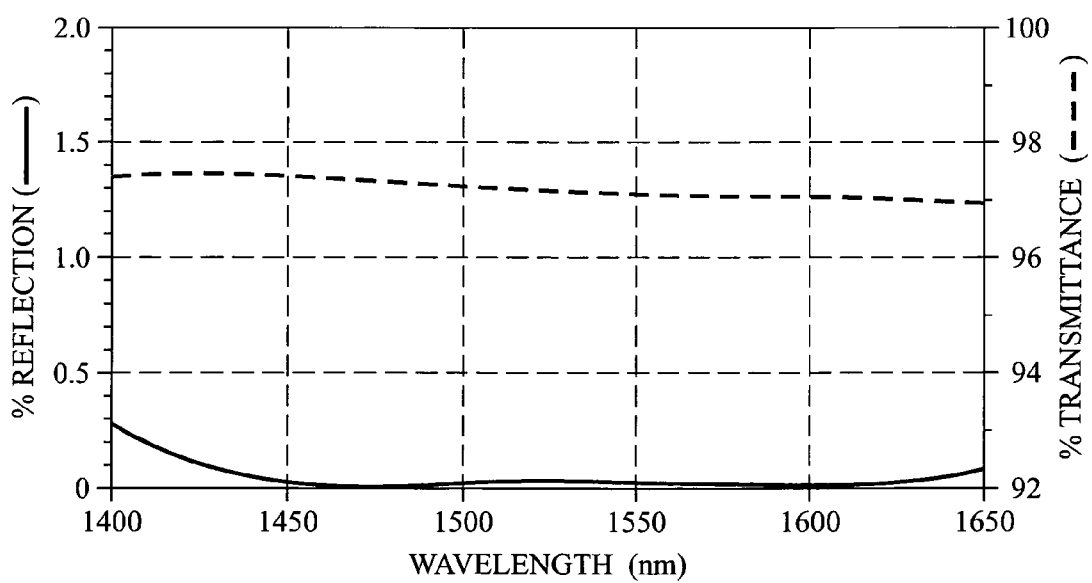

A third representation for a sensor according to the present invention and the transmission of light through such a sensor is shown in FIGS. 19a–b. In this design, as shown in FIG. 19a, a first layer of TiO2 is used having a thickness of approximately 158.34 nm. Deposited on top of this is a first ITO layer of 5 nm, on which is located a Si sensor region of 568.97 nm. Deposited on top of the Si layer is a second ITO layer of approximately 10 nm. Next is a layer of TiO2 of approximately 106.89 nm thick, and thereafter a layer of SiO2 181.15 nm thick is deposited.

As illustrated by the graphical representation in FIG. 19, it is noted the transmittance percentage of light at the 1500 nm wavelength is approximately 97%.

From the forgoing designs and the graphical representations of the outputs in FIGS. 17a through 19b of these designs, it may be seen that improvements may be achieved in the percentage of light transmitted. However, improving the output does include at times more complicated deposition processes. For example, in the last mentioned design as reflected by FIGS. 19a–b, the improvement is achieved, however it is necessary to use extremely thin layers of the ITO.

Figure 20:
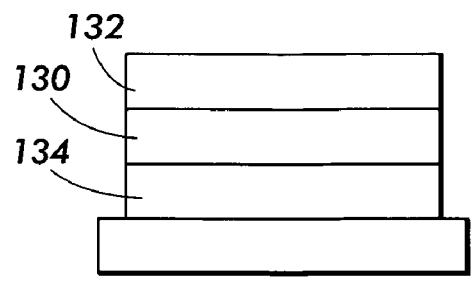
FIG. 20 illustrates the formation of anti-reflection coatings over both top and bottom surfaces of the sensor.

Turning to FIG. 20, each of the sensors of the foregoing descriptions may take advantage of an additional anti-reflective coating on the device backside. More particularly, a sensor 130 formed of amorphous silicon or other appropriate material has patterned on its upper surface a distributed bragg reflector 132. A second distributed bragg reflector 134 is configured below the sensor 130, creating a Fabry Perot cavity. Formation of this cavity allows for the creation of an electric field standing wave profile. The standing wave profile is then designed to have a low amplitude at the electrode region which in turn minimizes absorption losses at the electrode. Careful attention needs to be placed in optimizing the tradeoff between minimizing absorption in the ITO and maximizing transmission through the layer stack. It is to be understood that this feature and concept may be applied to all embodiments previously described.

Figure 21A:
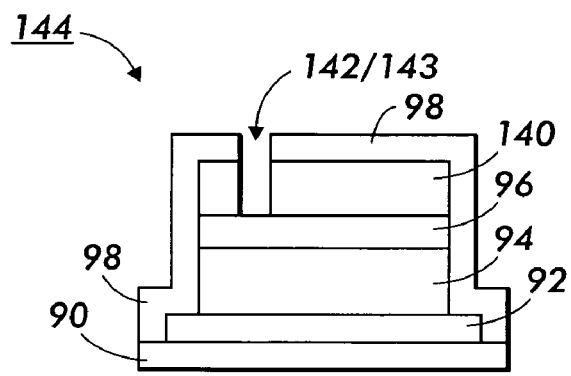
FIGS. 21a–21b set forth side views of a further embodiment of a sensor according to the teachings of the present invention implementing an absorption layer.
Figure 21B:
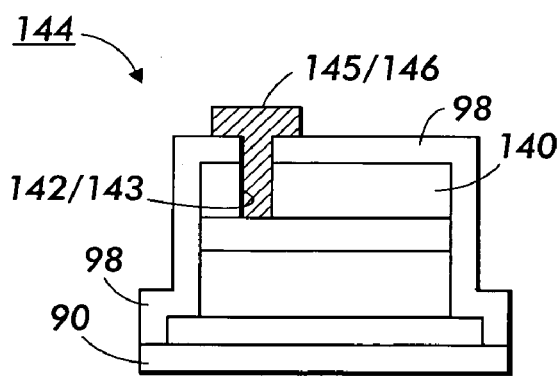
Figure 22A:
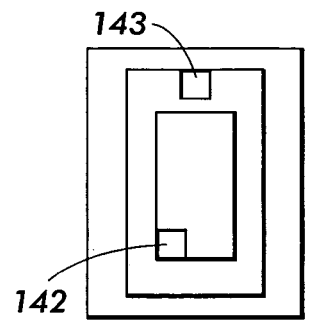
FIGS. 22a–22b depict a top view of FIGS. 21a–21b.

Turning to FIGS. 21a–b and 22a–b, another embodiment of the present invention is illustrated. When operated below its threshold conditions, a laser will emit light through a process known as spontaneous emission. This spontaneous emission may contain light in the visible wavelength range that is highly absorbed by the sensor material. It is undesirable to have this light, as well as light of any other undesired wavelength, reaching the active sensor element 94. Therefore, to further improve the operation of the present invention, when IR lasers are used, an additional processing step may be added. Particularly, after the application of second transparent/conductive layer 96 (as depicted in FIG. 5b), a visible light absorption filter 140, which may be hydrogenated amorphous silicon (a-Si:H), is deposited on top of second transparent/conductive layer 96 prior to sensor element 94 and second transparent/conductive layer 96 being patterned. Visible light absorption layer 140 is opaque to visible light, and transparent to IR light. Once sensor element 94, second transparent/conductive layer 96 and visible light absorption layer 140 have been deposited on top of first transparent/conductive layer 92, they are patterned. Next, and similar to FIG. 5c, passivation layer 98 is deposited over this patterned stack, and over transparent/conductive layer 92 and substrate 90. Thereafter, and as shown in FIGS. 21a and 22a, vias 142 and 143 are provided through passivation layer 98 and visible light absorption layer 140, to provide access to transparent/conductive layers 96 and 92. By this design, an electrically isolated sensor 144 is formed. The anti-reflection coating needs to be modified as appropriate.

Figure 22B:
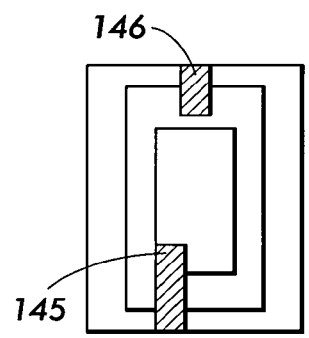

As depicted in FIGS. 21b and 22b, metal layers 145 and 148 are deposited in a manner similar to that discussed in relationship to FIGS. 5d and 6d.

The embodiment shown in FIGS. 21a–21b and 22a–22b adds visible light absorption layer 140, which provides a manner of preventing spontaneously emitted visible light from impinging upon active sensor element 94. This avoids false readings from sensor 144.

When the laser goes above the laser threshold, spontaneous emissions may still exist, too. An ideal sensor is "blind" to the spontaneous emission component, i.e. it has a very narrow bandwidth. Therefore it reads nothing but the resonant component of the laser operation. Absorption layer 140 is able to absorb the continuing spontaneous emissions, so that it does not reach sensor element 94.

When a semi-transparent sensor is configured for use with a light-emitting device which emits a light in the wavelengths starting at approximately 1.3 microns and above, consideration must be given to the formation of electrodes which, in one example is configured of indium-tin oxide (ITO). Specifically ITO electrodes become absorbing in the range of 1.3 microns and above. In consideration of this, ITO material for such use must be designed to be less absorbent. To achieve this, the ITO is formed to contain more oxygen than ITO films used in systems which employ wavelengths below 1.3 microns. Using ITO with an increased level of oxygen, permits for a more transparent film for use on the sensor. However, a tradeoff in obtaining this higher transparency is an increase in the resistance of the film. Therefore, consideration needs to be taken as to the tradeoff between resistance and transparency dependent upon the particular implementation. For shorter wavelengths such as 850 nm, the ITO electrode would be configured to have transparency, and have as much conductivity as possible. An ITO electrode for systems operating at approximately 1.1–1.7 micron wavelengths will differ in composition and thickness from that of a sensor to be used in connection with a laser producing 850 nm wavelength beams.

Figure 23:
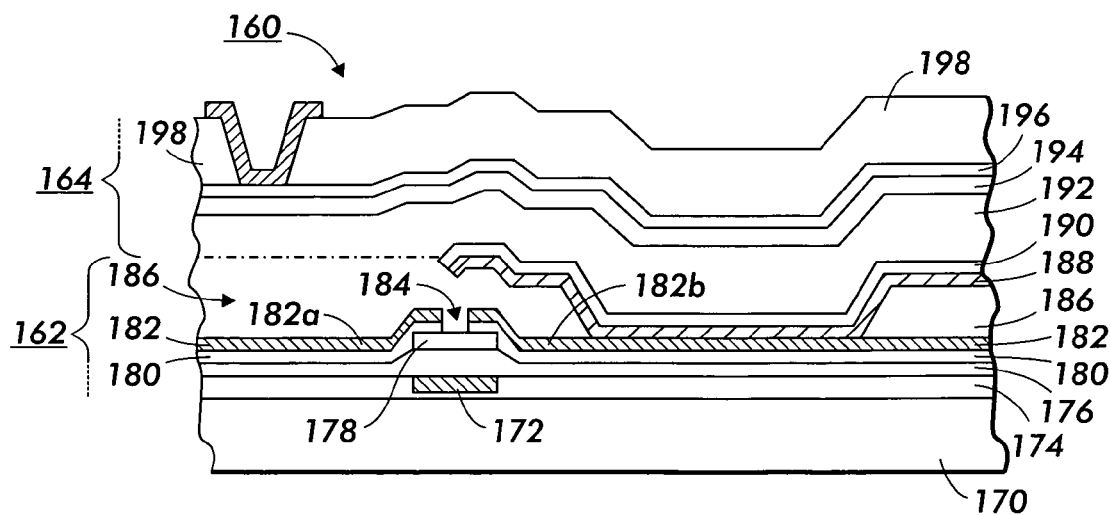
FIG. 23 illustrates a semi-continuous sensor in connection with the TFT construction.

Turning to FIG. 23, the cross section of an integrated device 160 is illustrated having a transistor, e.g. Thin-Film Transistor (TFT) switch 162 configured below a semicontinuous sensor 164. In this embodiment, p-i-n-amorphous silicon (a-Si:H) sensor 104 of FIGS. 5b and 6b is replaced by a more elaborate composition. The combination of TFT switch 162 and semi-continuous sensor 164 are meant to be shown as a pixel, or picture element of a 1- or 2-dimensional array, enclosed in a layer of passivation, for operation as an active matrix sensor.

With more particular attention to the construction of device 160, deposited on a transparent substrate 170 such as glass, is a gate contact 172 formed of a transparent metal, such as Chromium (Cr). Metal layer 172 is deposited in a thickness of approximately 3,000 angstroms, and acts as the gate contact of TFT switch 162. Deposited over metal portion 172, and remaining portions of substrate 170, is a first transparent/conductive layer 174, such as nitride, oxynitride, polyamide or other appropriate material, which is typically deposited to approximately 3,000 angstroms in thickness. Deposited over layer 174 is a layer 176 of an intrinsic hydrogenated amorphous silicon (a-Si:H), typically 500 angstroms thick.

An island of nitride (oxynitride, polyamide, etc.) 178 is deposited and patterned over gate contact 172 on the a-Si:H layer 176. Island 178 is typically deposited to a thickness of approximately 2,000 angstroms.

A layer of n-doped a-Si:H 180 is then deposited and selectively patterned to a thickness of approximately 1,000 angstroms over nitride island 178 and layer 176.

Next, a layer of transparent conductor 182 is deposited on top of island 178, and an opening 184 is patterned to create two electrodes 182a, 182b from layer 180. The metal of layer 182 may typically be configured of Indium Tin Oxide (ITO). Patterns 182a and 182b act as the source and drain contacts for TFT transistor 162. A passivation layer 186 is patterned on top of conductor layer 182 and may typically be oxynitride of approximately 1 micron, or alternatively a polyamide layer of approximately 2.3 microns thickness. A via in layer 186 is opened, such that a transparent/conductive layer 188, typically made of ITO, and an $n^+$-doped amorphous silicon layer 190, are deposited and patterned in a mushroom-shape inside and over the via. Layer 188 functions as the bottom electrode of sensor 164. Layer 188 is deposited such that, in the via, it is in contact with layer 182 and over remaining portions of layer 186. The $n^+$-doped contact layer 190 is typically 700 angstroms thick.

A continuous layer of intrinsic amorphous silicon (a-Si:H) 192 is deposited over the $n^+$-doped contact 188 and portions of the passivation layer 186. This layer of sensor 164 has a typical thickness of approximately 1 micron.

A $p^+$-doped layer 194 is then deposited over intrinsic a-Si layer 192 to a thickness of approximately 100 angstroms. A transparent/conductive layer 196, typically made of ITO and 5,500 angstroms thick, acts as a top electrode of sensor 164. Thereafter, a top passivation layer 198 is deposited and patterned.

This embodiment of device 160, therefore, consists of a TFT transistor 162 which is connected to the semi-continuous sensor 164 through the opening created in passivation layer 186. The sensor 164 is otherwise separated from the TFT on a top level by portions of passivation layer 186 that have not been etched away. It is to be appreciated that the described semi-continuous sensor 164 may be constructed using the materials and thickness described above, for operation with specific light wavelengths in the range of 700 nm–3 microns.

In the foregoing embodiments, discussion has been generally directed to a sensor sensing a single laser output. However, in many instances, the sensor will be defined for use with an array of lasers such as used on an image print bar.

In a typical print bar arrangement, a large number of individual light-emitting sources such as lasers, LED or other light sources are arranged in an elongated, planer array that is placed adjacent an image recording member. By providing relative motion between the print bar and the image recording member, the print bar scans the image recording member, and by selectively illuminating the individual light-emitting sources, a desired light image is recorded on the image recording member.

Figure 24:
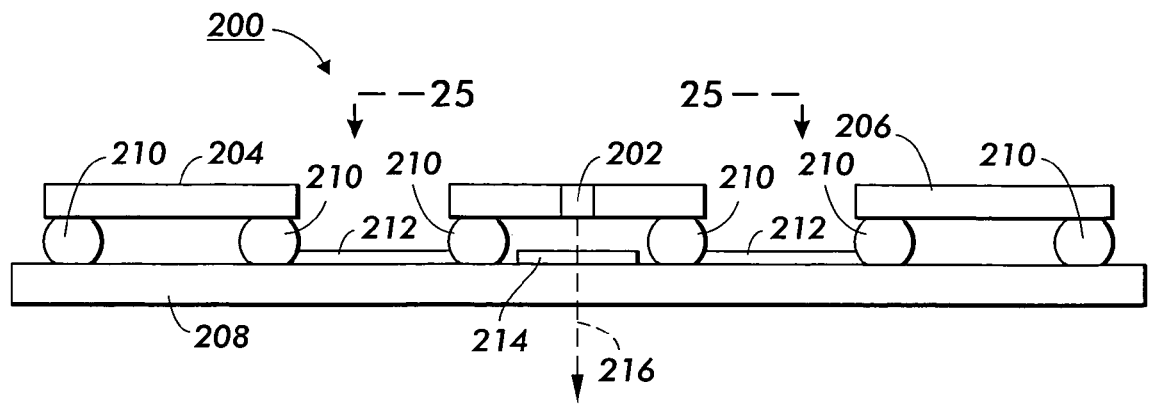
FIG. 24 and FIG. 25 illustrate side and top views of a system using an array of light-emitting devices and a sensor sufficient in size to sense each of these elements.

Turning to FIG. 24, shown is a cross-section of a print bar/sensor system 200 employing the concepts of the present invention. In one embodiment, system 200 includes an array of lasers 202, a first driver chip 204 and a second driver chip 206. Each of driver chips 204 and 206 can control operation of lines from one side of the array of lasers 202. Connection between driver chips 204 and 206 and the array of lasers 202 is achieved by connection to substrate 208 via flip-chip technology implementing solder connections such as solder balls 210. Substrate 208 carries electrical tracings 212 permitting connection between laser array 202 and controller chips 204 and 206. Semi-transparent sensor 214 senses a portion of emitted light 216 to assist in the calibration of laser array 202. Particularly, it is noted that substrate 208 as well as sensor 214 are transparent and laser beam (IR radiation) 216 is capable of passing substantially unobstructed through substrate 208 and sensor 214. By forming sensor 214 in a fashion which allows it to be aligned with a high degree of precision in front of laser array 202, it is possible to obtain in situ information as to laser output for each of lasers of the laser array 202.

Figure 25:
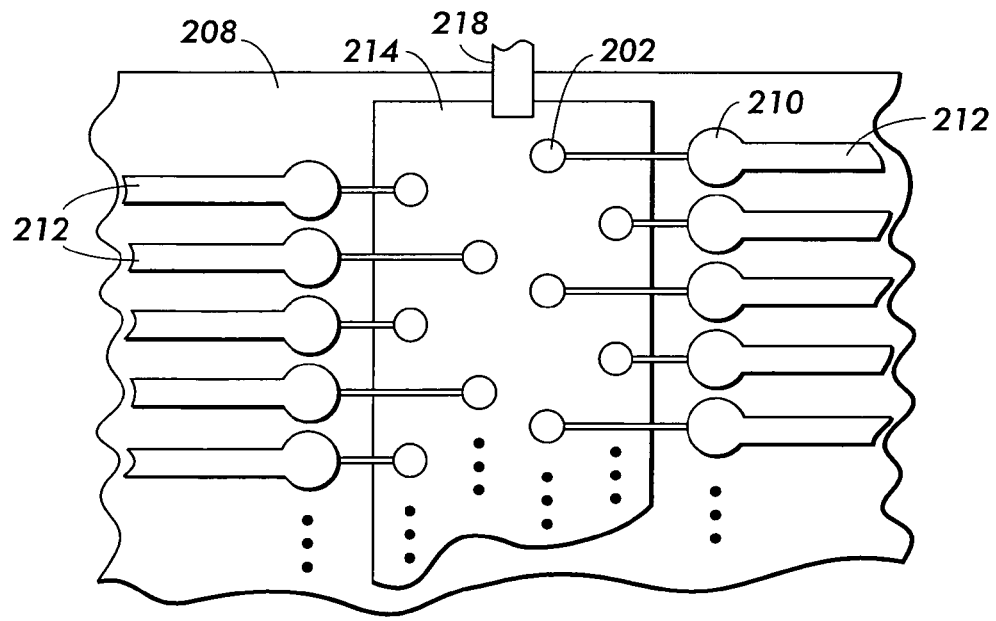

FIG. 25 depicts a bottom view of FIG. 24. sensor 202, solder balls 210 and electrical tracings 212 are on substantially the same plane nearest the page surface, and laser array 202 is on the back of the page. Contact pads 216 and electrical tracings 212 are provided for connection to chips 204 and 206 respectively. FIG. 25 emphasizes the importance of alignment between sensor 214 and the array of lasers 202, in that sensor 214 is sufficiently sized to cover all lasers 202 in this embodiment. Sensor feedback lines 218 are shown extending from sensor 214. Sensor feedback lines 218 are capable of carrying readout current used for various purposes including calibration operations. FIG. 25 emphasizes the importance of alignment between sensor 214 and the array of lasers 202, in that sensor 214 is sufficiently sized to cover all lasers of the array 202.

Figure 26:
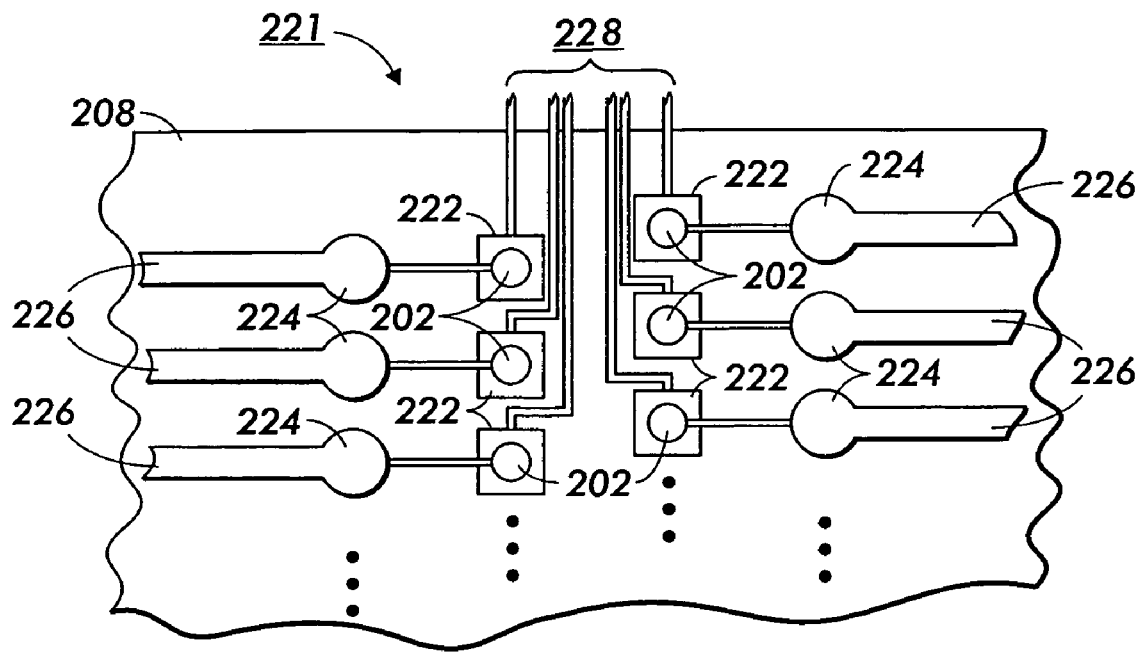
FIG. 26 shows a top view of a system using an array of light-emitting devices and a plurality of sensors, each sensor sized to sense a corresponding light-emitting device.

Turning to FIG. 26, shown is a top view of a further embodiment of a light-emitting/sensor arrangement 221. FIG. 26 highlights the relationship between the light-emitting array 202 (such as shown in FIG. 24) and distinct sensors 222 individually aligned to lasers of the array 202. Contact pads 224 and electrical tracings 226 provide the connection to components such as chips 204 and 206 of FIG. 24.

With further attention to FIG. 26, sensor feedback lines 228 are provided for each individual sensor 222 and are illustrated extending from the sensors. Sensor feedback lines 228 are capable of carrying readout current used for various purposes including calibration operations. FIG. 26 emphasizes the importance of alignment between the sensors 222 and the array of lasers 202, and that the sensors 222 may be individually sized and correlated to specific lasers of the array.

The foregoing described systems 200 and 221 emphasize arrangements which allow for calibration of lasers. Such a calibration system is described more fully in the hereby incorporated U.S. Ser. No. 09/469,122, and its disclosure is equally applicable to use with the presently described laser-emitting devices and sensors.

It is also to be appreciated that use of the present invention with light emitting arrays other than for use with print bars is equally applicable. For example, such other use maybe in connection with communication in the telecommunication industry and other industries. FIGS. 24 and 25 do not illustrate lenses to focus the output light, either as elements separate from the substrate, or integrated therein on its backside. Such arrangements are also possible using the array of lasers and the sensor of the present invention.

Figure 27:
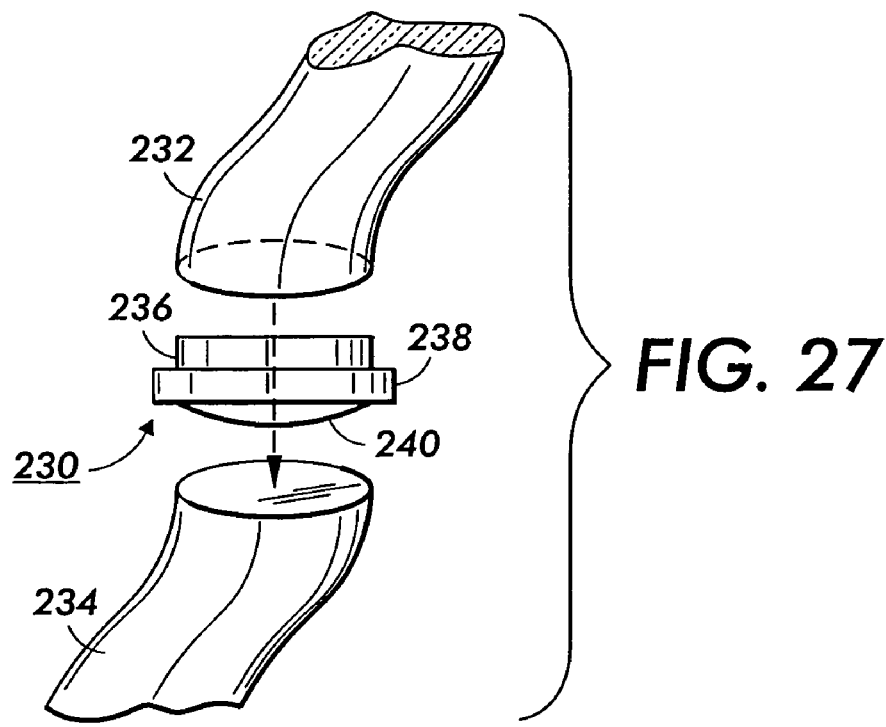
FIG. 27 depicts the sensor device of the present invention used between two fiber-optic cables.

Turning to FIG. 27, a further embodiment of the present invention is illustrated. More particularly, a light sensor configuration 230 as previously described is inserted within the path of an optical fiber 232 which transmits a light signal generated by a light source 233 and passes that signal to another optical light fiber 234. It is noted that light source 233 may be located off-site or far away from light sensor configuration 230.

The semi-transparent sensor 236 is located on a first surface of substrate 238 and a focusing element 240 such as a lens is on the opposite surface. This embodiment illustrates that the present invention may be used in a situation where the light to be sensed is not generated by use of a light source located on site, but rather is produced from an off-site source and is transmitted to sensor configuration 230. In this embodiment sensor configuration 230 acts as an optical coupler, to bring two optical fibers together. Use of the present invention allows for sensing of a portion of the light being passed, by sensor 236, in order to monitor the amount of light or to note if a link failure or other form of failure exists in the connection. While the embodiment of FIG. 27 shows the lens 240 integrated to substrate 238. It is to be appreciated that a separate non-integrated lens may be used, or no lens may be used. Further, the light focusing element 240 may also be a collimator. In this embodiment configuration 230 is used to sense and collimate a diverging light from optical fiber 232. As mentioned previously, a collimator may also be used in connection with a single light source such as those described above.

The foregoing is considered as illustrative only of the principles of the invention. Further, since numerous modifications and changes will readily occur to those skilled in the art, it is not desired to limit the invention to the exact construction and operation as shown and described, and accordingly, all suitable modifications and equivalents may be resorted to falling within the scope of the invention.

Having thus described the invention, it is now claimed:

1. A light producing and monitoring system comprising:
a light producing device from which light is emitted with wavelengths that can range from approximately 700 nm to approximately 3 microns; and
a semi-transparent sensor manufactured on a semi-transparent substrate separate from the light-producing device, the semi-transparent substrate bonded to the light-producing device to position the light-producing device where the semi-transparent sensor is located in front of the light producing device, at least a portion of the emitted light passes through the semi-transparent sensor and at least a portion of light is absorbed by the semi-transparent sensor, wherein the semi-transparent sensor is configured to be semi-transparent at the wavelength of the emitted light, the sensor including:
a first transparent/conductive electrode layer deposited on the substrate,
an active sensor element deposited on top of the first transparent/conductive layer,
a second transparent/conductive electrode layer deposited on top of the active sensor element, and
an absorption layer deposited on top of the second transparent/conductive electrode layer to prevent visible light from reaching the active sensor element.

2. The system according to claim 1, wherein the semi-transparent substrate includes one of a quartz, silica, gallium arsenide, and glass substrate.

3. The system according to claim 2 wherein the light producing device and the substrate are connected together by a flip-chip process via solder bumps to define an air gap between the light producing device and the sensor.

4. The system according to claim 1 wherein, the active sensor element is configured of sub-layers including,
a first sub-layer consisting of at least one of a n+ doped amorphous silicon or an amorphous silicon-germanium compound,
a second sub-layer consisting of at least one of intrinsic amorphous silicon or an amorphous silicon-germanium compound, and
a third sub-layer consisting of at least one of a p+ doped amorphous silicon or an amorphous silicon-germanium compound.

5. The light producing and monitoring system as set forth in claim 1, wherein
the first transparent/conductive electrode layer deposited on the substrate is comprised of at least one of, Indium Tin Oxide, Tin Oxide, Zinc Oxide, or polycrystalline silicon; and
the second transparent/conductive electrode layer deposited on top of the active sensor is comprised of at least one of, Indium Tin Oxide, Tin Oxide, Zinc Oxide, or polycrystalline silicon.

6. The system according to claim 1, further including:
a passivation/release layer located over at least the first transparent/conductive electrode layer and the second transparent/conductive electrode layer.

7. The system according to claim 1, wherein the semi-transparent sensor further includes:
an anti-reflection coating deposited on an upper surface of the second transparent/conductive electrode layer to prevent a light reflection loss.

8. The system according to claim 1, wherein the semi-transparent sensor further includes:
an anti-reflection coating deposited on a lower surface of the first transparent/conductive electrode layer to prevent a light reflection loss.

9. A light producing and monitoring system comprising:
a light producing device from which light is emitted with wavelengths that range from approximately 700 nm to approximately 3 microns;
a semi-transparent substrate; and
a semi-transparent sensor configured on the semi-transparent substrate including:
a first transparent/conductive layer deposited on the substrate,
an active sensor element deposited on top of the first transparent/conductive layer,
a second transparent/conductive layer deposited on top of the active sensor element,
a first anti-reflection layer deposited on top of the second transparent/conductive layer to prevent a light reflection loss, and
an absorption layer deposited on top of the first anti-reflection layer to prevent visible light from reaching the active sensor element,
the semi-transparent sensor being located in front of the light producing device, to allow at least a portion of the emitted light to pass through the semi-transparent sensor and at least a portion of light to be absorbed by the semi-transparent sensor, the semi-transparent sensor being configured to be semi-transparent at the wavelength of the emitted light.

10. A light producing and monitoring system comprising:
a light producing device from which light is emitted with wavelengths that can range from approximately 700 nm to approximately 3 microns;
a semi-transparent substrate;

a semi-transparent sensor including:
  a first anti-reflection layer deposited on the substrate,
  a first transparent/conductive electrode layer deposited on top of the first anti-reflection layer,
  an active sensor element deposited on top of the first transparent/conductive layer and including semiconductor layers,
  a second transparent/conductive electrode layer deposited on top of the active sensor,
  a second anti-reflection layer deposited on top of the second transparent/conductive layer, and
  an absorption layer deposited on top of the second anti-reflection layer to prevent visible light from reaching the active sensor;
the semi-transparent sensor located in front of the light producing device, such that at least a portion of the emitted light passes through the semi-transparent sensor and at least a portion of light is absorbed by the semi-transparent sensor, and wherein the semi-transparent sensor is configured to be semi-transparent at the wavelength of the emitted light.

11. The system according to claim 10, wherein the transparency of the sensor is approximately equal to or greater than 90%.

12. The system according to claim 11, wherein the transparency of the sensor is equal to about 95%.

13. The system according to claim 10, wherein each anti-reflection layer includes silicon.

14. The system according to claim 10, wherein a thickness of each anti-reflection layer is selected to approximately match the wavelength emitted by the light producing device.

15. The system according to claim 10, wherein at least one of the first and second anti-reflection layers includes a plurality of layers.

16. The system according to claim 15, wherein the anti-reflection layers include at least one of:
doped magnesium;
doped cerium; and
doped silicon.

17. The system as set forth in claim 9, further including:
a passivation/release layer located over at least the first transparent/conductive layer and the second transparent/conductive layer.

18. The system as set forth in claim 17, further including:
a second anti-reflection layer deposited about a lower surface of the first transparent/conductive layer to prevent a light reflection loss.

* * * * *